United States Patent [19]
Miller et al.

[11] Patent Number: 6,008,636
[45] Date of Patent: Dec. 28, 1999

[54] TEST SYSTEM WITH ROBOT ARM FOR DELIVERING A DEVICE UNDER TEST

[75] Inventors: James K. Miller, Spring Grove; Robin J. Crawford, Wonder Lake, both of Ill.

[73] Assignee: Motorola, Inc., Schaumburg, Ill.

[21] Appl. No.: 08/940,315

[22] Filed: Sep. 30, 1997

[51] Int. Cl.⁶ .................................................. G01R 1/04
[52] U.S. Cl. ................. 324/158.1; 324/765; 414/222.13
[58] Field of Search ................................ 324/765, 158.1; 414/426, 428, 724, 222.01, 222.13, 225.01, 226.01–226.05; 901/7, 8; 395/94, 93, 80; 198/341.01, 341.04, 341.08; 29/701, 705, 710, 712, 722, 742

[56] References Cited

U.S. PATENT DOCUMENTS

| | | | |
|---|---|---|---|
| 4,850,104 | 7/1989 | Matrone et al. | 29/705 |
| 5,191,282 | 3/1993 | Liken et al. | 324/537 |
| 5,290,134 | 3/1994 | Baba | 414/404 |
| 5,374,888 | 12/1994 | Karasaw | 324/765 |
| 5,384,531 | 1/1995 | Yamazaki | 324/765 |
| 5,501,571 | 3/1996 | Van Durrett et al. | 414/801 |
| 5,509,191 | 4/1996 | Best | 29/722 |
| 5,632,590 | 5/1997 | Pearson et al. | 414/404 |
| 5,865,319 | 2/1999 | Okuda et al. | 209/574 |

OTHER PUBLICATIONS

Adept Technology, Inc. and Silma, division of Adept Technology, Inc., "AdeptOne–MV", Sep. 05, 1997, web page address: http://www.industry.net/c–a/showfile/03ttt/national/03ttt/ade46/DoAuth.

*Primary Examiner*—Diep N. Do
*Attorney, Agent, or Firm*—Mark D. Patrick

[57] ABSTRACT

A test system (100) for testing electronic devices includes a conveyor (130) to convey the electronic devices, a test fixture (112) to test the electronic devices, and a robot apparatus (102). The robot apparatus (102) has a robot arm (118) positionable within an accessible region (216) to deliver electronic devices from the conveyor (130) to the test fixture (112) via an arcuate path.

19 Claims, 4 Drawing Sheets

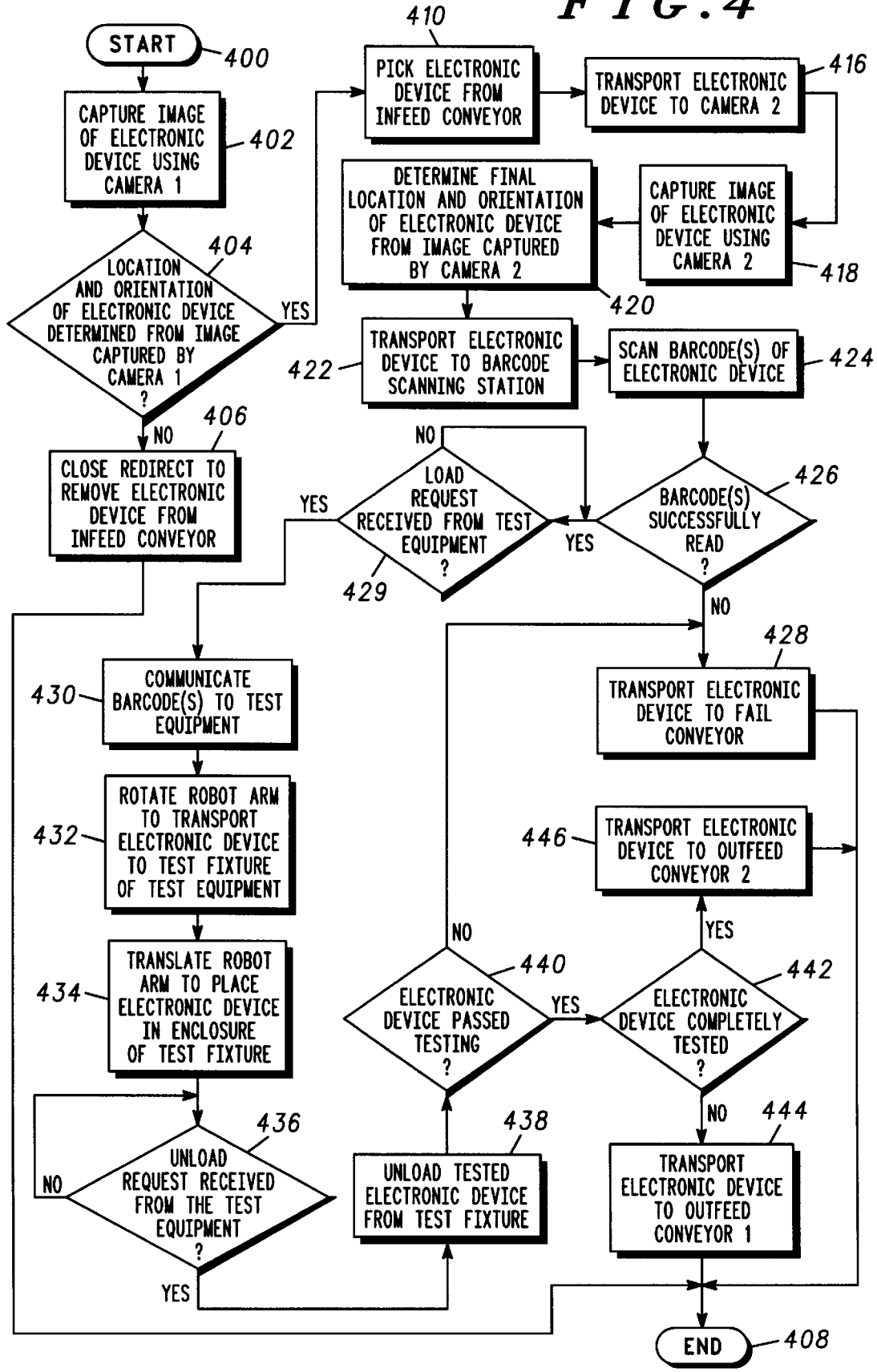

TEST SYSTEM WITH ROBOT ARM FOR DELIVERING A DEVICE UNDER TEST

FIELD OF THE INVENTION

The present invention relates generally to automated testing of electronic devices and, more particularly, to a test system for electronic devices that employs a robot.

BACKGROUND OF THE INVENTION

For quality control purposes, most manufacturers test the operability of electronic devices they build. In order to remain competitive in the industry, manufacturers must test the electronic devices at a high speed. High speed testing of electronic devices is achieved, at least in part, through automation.

One known automated test system employs a single conveyor for serially transporting electronic devices in pallets to individual test stations positioned alongside the conveyor. Each of the test stations is equipped with a lift and load apparatus for lifting a pallet containing an untested electronic device off of the conveyor and loading the pallet into a test fixture of the test station, and for unloading the pallet from the test fixture after testing of the electronic device and lowering the pallet back onto the conveyor. Unfortunately, the test system has drawbacks. To completely test an electronic device, the electronic device must travel a length of the conveyor dictated by the size and spacing of all of the test stations. Also, the pallets are custom fitted to the dimensions of the electronic devices and must be retrofitted or replaced in order to test differently dimensioned electronic devices. Furthermore, equipping each test station with a lift and load apparatuses results in increased maintenance and increased opportunity for down time.

Therefore what is needed is an improved automated test system that maximizes throughput, increases flexibility in testing differently-sized electronic devices, and minimizes maintenance and downtime.

BRIEF DESCRIPTION OF THE DRAWINGS

FIG. 4 is a flow chart of a method of operation of the robotic test system of FIG. 1.

DETAILED DESCRIPTION OF THE DRAWINGS

A test system for testing electronic devices includes a conveyor to convey the electronic devices, a plurality of test fixtures to test the electronic devices, and a robot apparatus. The robot apparatus has a robot arm that is positionable within an accessible region of the test system. The robot arm moves through an arcuate path to pick up and transport electronic devices between the conveyor and the test fixtures. Unlike previous systems that employed a separate lift and load apparatus for each test fixture, the single robot apparatus of the test system serves all of the test fixtures. As a result, less equipment is required to test the electronic devices, and maintenance and downtime are minimized.

Figure 1:
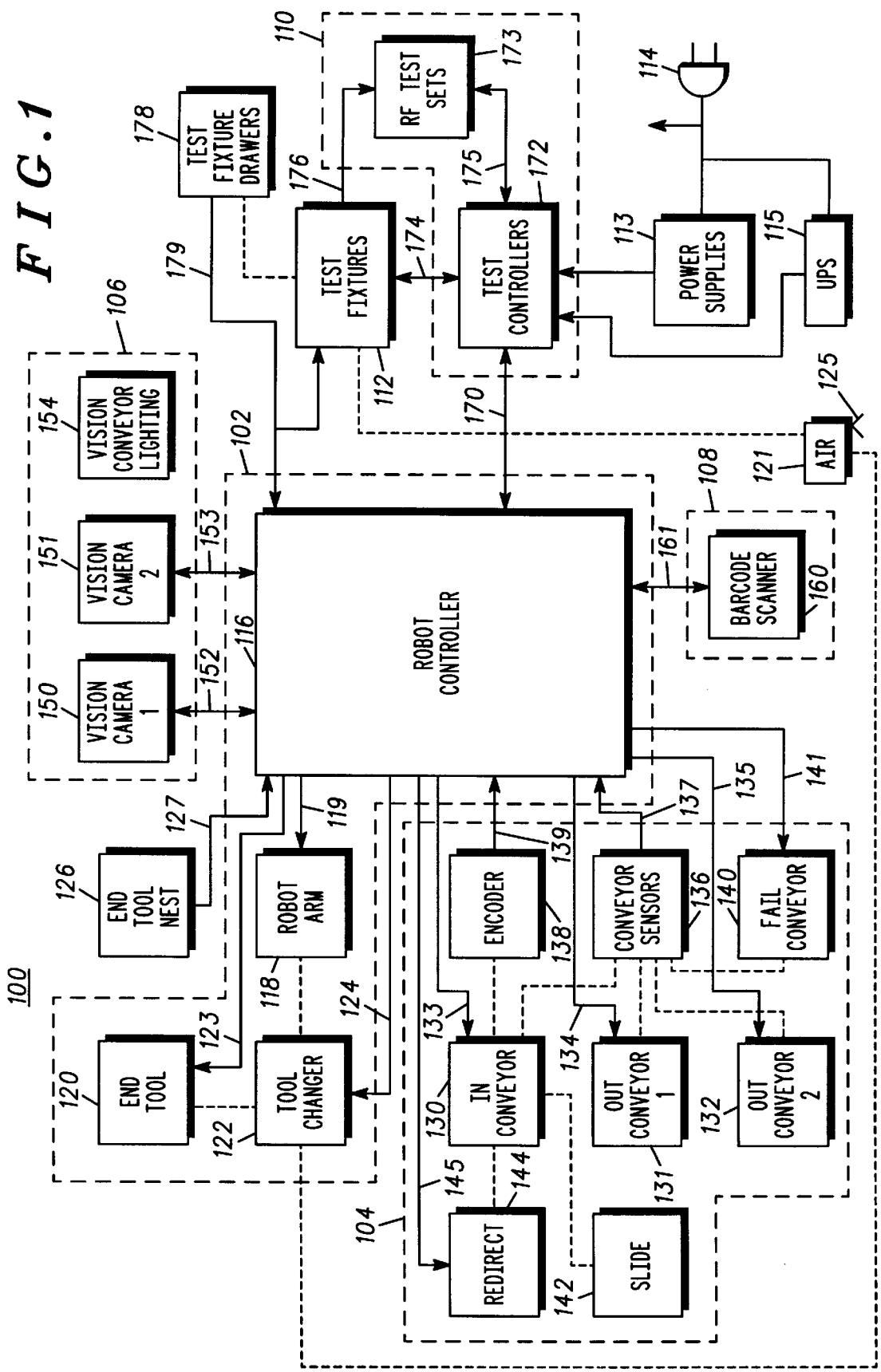
FIG. 1 is a functional block diagram of a robotic test system, wherein solid connecting lines designate electrical connections and broken connecting lines designate mechanical connections.
Figure 2:
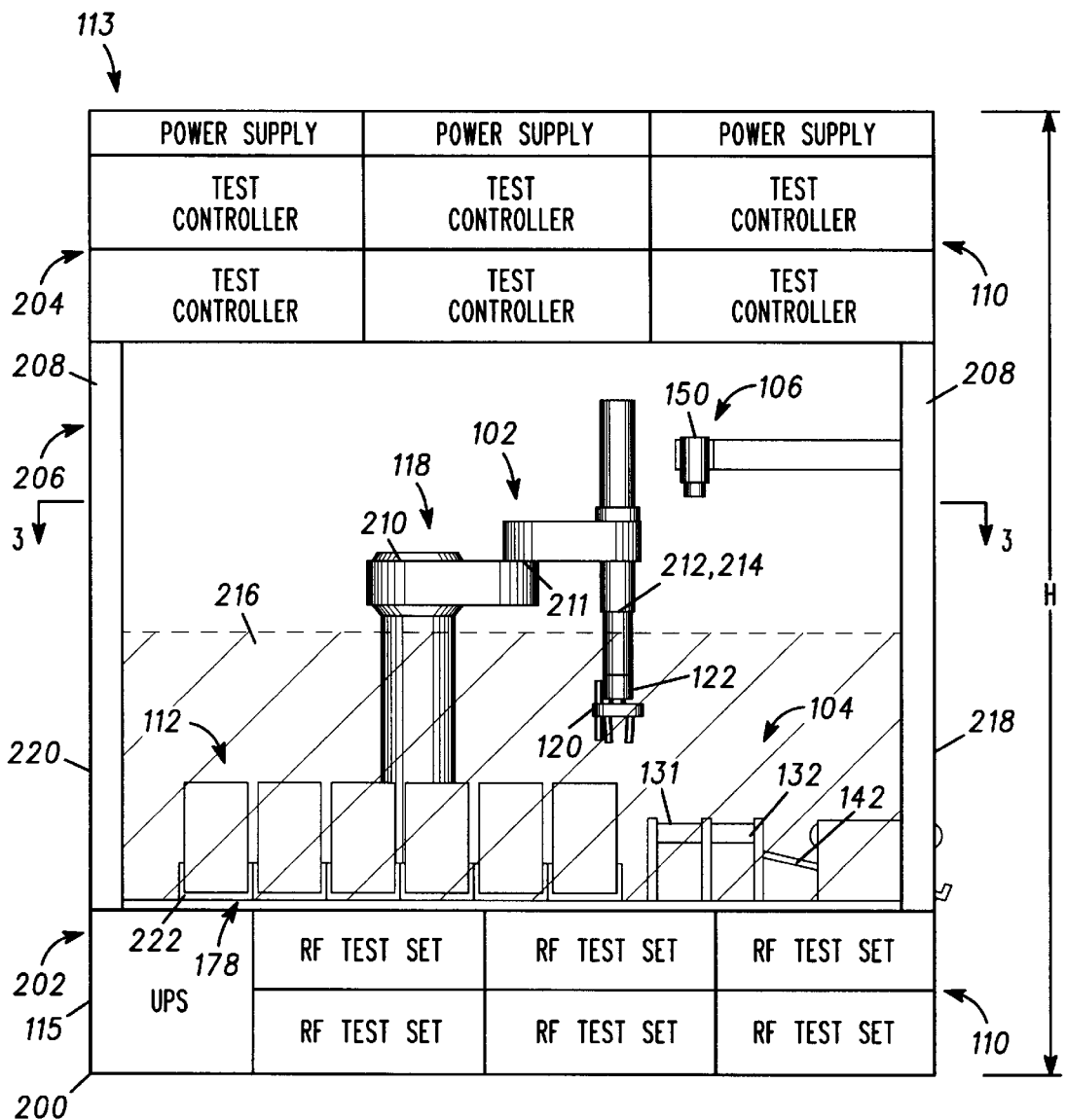
FIG. 2 is a left side elevational view of the robotic test system of FIG. 1.
Figure 3:
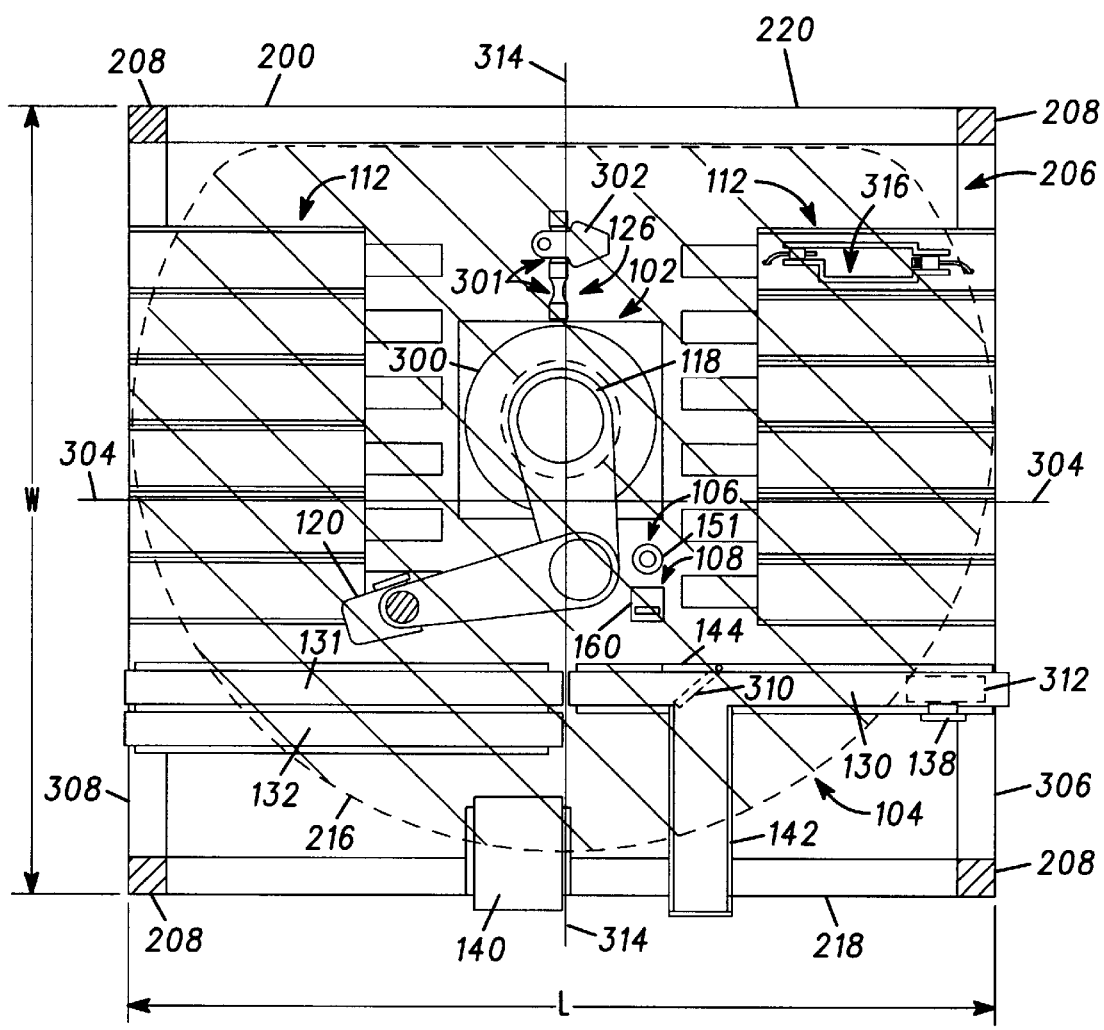
FIG. 3 is a cross-sectional view of the robotic test system of FIG. 1 taken along section lines 3—3 of FIG. 2.

A robotic test system 100 for testing electronic devices is shown in FIGS. 1–3. The robotic test system 100 is operable as a stand alone test system or as a modular station that is one of a plurality of similar or different test systems in a manufacturing environment. The robotic test system 100 includes a robot apparatus 102, a conveyor system 104, a vision guidance system 106, a barcode scanning station 108, a plurality of test equipment 110, and a plurality of test fixtures 112. The robotic test system 100 is powered by transformed and/or regulated power derived from an alternating current (AC) source provided via a wall plug 114. A plurality of power supplies 113, which are preferably twelve model SM-03 controllable power supplies commercially available from Keithley Instruments, Inc. or suitable alternative, are supplied by the AC source via the wall plug 114 and coupled to the test equipment 110. A universal power supply (UPS) 115 is connected to the test equipment 110 and the wall plug 114 and has rechargeable batteries that are maintained at a fully charged level by the AC source so as to provide back up power in the event of failure of the AC source.

The robotic test system 100 is housed in a substantially rectangular frame 200 that, in the illustrated embodiment, has a width W of approximately 2 m, a length L of approximately 2 m, and a height H of approximately 3.25 m. The frame 200 has a base 202, a canopy 204, and a test area 206 located therebetween. The test area 206 houses the robot apparatus 102, the conveyor system 104, the vision guidance system 106, the barcode scanning station 108, and the test fixtures 112. The base 202 and the canopy 204 house the test equipment 110, the power supplies 113 and the UPS 115. Wiring for electrically connecting the test equipment 110 in the canopy 204 to the remainder of the robotic test system 100 housed in the test area 206 and the base 202 is routed within, or tie wrapped to, columns 208 of the frame 200 that interconnect the base 202 and the canopy 204. In the illustrated embodiment, the base 202, the canopy 204, and the test area 206 have respective volumes of approximately 2.5 m$^3$, approximately 5 m$^3$, and approximately 6.25 m$^3$.

The robot apparatus 102 is mounted approximately in a center of the test area 206 of the frame 200. The robot apparatus 102 includes a robot controller 116 housed in a base 300 of the robot apparatus 102. The robot controller 116 controls operation of the robotic test system 100 from a breakout panel (not shown), which makes the electrical connections to the conveyor system 104, the vision guidance system 106, the barcode scanning station 108, and the test equipment 110, as shown in FIG. 1. The robot controller 116 controls robot arm motion, vision guidance and processing tasks, conveyor control, barcode scanner control, test equipment input/output, and equipment interfacing according to the SMEMA (Surface Mount Equipment Manufacturers Association) interface standard or other interfacing standard. The robot controller 116 is preferably an Adept MV-10 controller commercially available from Adept Technology, Inc., but may be any other suitable controller.

The robot apparatus 102 includes a robot arm 118 mounted to the base 300 of the robot apparatus 102 for transporting electronic devices in the robotic test system 100. The robot arm 118 has rotational joints 210, 211, and 212 and a translational joint 214. The rotational joints 210–212 permit movement of the robot arm 118 in arcuate paths about a horizontal plane. The translational joint 214 permits movement of the robot arm 118 in a vertical plane. The robot arm 118 is controlled by signals from the robot controller 116 via connection 119 to position a distal end of the robot arm 118 at a location within an accessible region 216, which extends coaxially between a mounted end of the robot arm 118 and the frame 200 as depicted by crosshatching in FIGS. 2 and 3. In the illustrated embodiment, the robot arm 118 is approximately 80 cm when fully extended in the horizontal plane and is downwardly extendible in the vertical plane to approximately 30 cm. The robot arm 118 is preferably an AdeptOne-MV four-axis SCARA (Selectively Compliant Articulated Robot Arm) robot commercially available from Adept Technology, Inc. with HyperDrive option and a cycle time of approximately 4.25 sec./m with a 9 kg payload, but may alternatively be any other suitable robot arm.

The robot apparatus 102 includes an end tool 120 carried on the distal end of the robot arm 118 for picking and placing the electronic devices. The end tool 120 employs a parallel gripper, such as that commercially available from Robohand Inc., which is sized to accommodate the electronic devices being tested by the robotic test system 100, such as, for example, a printed circuit board having a width of approximately 5 cm and a length of approximately 16 cm and a radiotelephone having a width of approximately 5.5 cm and a length of approximately 16.5 cm. The gripper is equipped with a rotary actuator and timing belt for rotation about its center axis in a horizontal plane. The end tool 120 is controlled by signals from the robot controller 116 via connection 123 to rotate the gripper, open the gripper, and/or close the gripper. In one embodiment, the end tool 120 employs a pair of the grippers to permit loading and unloading of electronic devices in and from the test fixtures 112 in one pass.

A tool changer 122 is coupled between the robot arm 118 and the end tool 120 to permit removable attachment of the end tool 120. The tool changer 122 is preferably a model Quick Change 30 tool changer commercially available from EOA Systems Inc., but may be any other suitable tool changer that is compatible with the robot arm 118. The tool changer 122 is coupled to an air pressure source 121, which is supplied by a regulated air pump (not shown) coupled to air hose input 125, to pneumatically attach the end tool 120 to the tool changer 122. A solenoid switch of the tool changer 122 is energized and deenergized by the robot controller 116 via connection 124 to apply and remove, respectively, the air pressure source 121 holding the end tool 120. The tool changer 122 facilitates automated swapping of the end tool 120 via an end tool nest 126 located in the test area 206 within the accessible region 216.

The end tool nest 126 has a plurality of receptacles 301 adapted to hold additional ones of the end tool 120 that are compatible with the tool changer 122. Sensors for detecting the occupancy of each of the receptacles 301 are positioned in the end tool nest 126 and electrically coupled to the robot controller 116 via connection 127. In the embodiment shown in FIG. 3, the end tool 120 is swapped out as follows: the robot controller 116 controls the robot arm 118 to position the end tool 120 in an empty one of the receptacles 301, the robot controller 116 deenergizes the tool changer 122 to pneumatically release the end tool 120 into the empty one of the receptacles 301, the robot controller 116 controls the robot arm 118 to position the tool changer 122 in engagement with a new end tool 302 seated in an occupied one of the receptacles 301, and the robot controller 116 energizes the tool changer 122 to pneumatically attach the new end tool 302. The new end tool 302 can be similar to the end tool 120 and swapped for maintenance changeover, or can be different from the end tool 120 and swapped for compatibility with a different electronic device that enters the robotic test system 100. Such automated swapping eliminates down time and reduce product changeover cycles.

The conveyor system 104 includes an infeed conveyor 130 and outfeed conveyors 131 and 132 for transporting electronic devices in the robotic test system 100. The conveyors 130–132 run parallel to a longitudinal axis 304 of the frame 200 and are mounted in the test area 206 approximately halfway between the longitudinal axis 304 and a front 218 of the frame 200. The infeed conveyor 130 extends into the test area 206 from a right side 306 of the frame 200. The outfeed conveyors 131 and 132 are coplanar and extend into the test area 206 from a left side 308 of the frame 200. In the illustrated embodiment, each of the conveyors 130–132 is a flat belt type conveyor having a width of approximately 13 cm and a length of approximately 90 cm, and the infeed and outfeed conveyors 130 and 131 are separated by approximately 0.5 cm. In one embodiment, the infeed conveyor 130 is preferably comprised of an opaque material to facilitate back lighting and enhance vision guidance. The conveyors 130–132 are preferably 2100 Series conveyors commercially available from Dorner Mfg. Co., but may be any other suitable conveyor having surfaces comprised of ESD (electro static discharge) preventive material.

The conveyors 130–132 are turned on and off by signals sent by the robot controller 116 via connections 133, 134, and 135, respectively. The infeed conveyor 130, when turned on, moves right to left and transports untested electronic devices entering the robotic test system 100 on the right side 306 into the accessible region 216. The outfeed conveyors 131 and 132, when turned on, are operable to move right to left and transport tested electronic devices from the accessible region 216 to the left side 308 and out of the robotic test system 100. Sensors 136 for detecting the presence of electronic devices on the conveyors 130–132 are mounted to the conveyors 130–132 at various locations and electrically coupled to the robot controller 116 via connection 137. A rotary encoder 138 for tracking conveyor speed, such as that commercially available from the Industrial Encoder Division of BEI Sensors & Systems Company, is mounted in contact with the infeed conveyor 130 and electrically coupled to the robot controller 116 via connection 139.

The conveyor system 104 includes a fail conveyor 140 for removing electronic devices from the robotic test system 100 that fail testing. The fail conveyor 140 is mounted in the test area 206 at the front 218 of the frame 200 and extends from the front 218 into the test area 206 perpendicular to the longitudinal axis 304. The fail conveyor 140 is turned on and off by signals sent by the robot controller 116 via connection 141. When turned on, the fail conveyor 140 moves back to front to transport failed electronic devices from the accessible region 216 of the test area 206 towards, and out of, the front 218 for removal from the robotic test system 100. One or more of the sensors 136 is mounted to the fail conveyor 140. In the illustrated embodiment, the fail conveyor 140 has a width of approximately 20 cm and a length of approximately 40 cm and is of a type that is substantially similar to the conveyors 130–132.

The conveyor system 104 includes a slide 142 and a redirect 144 mounted to the infeed conveyor 130. The slide 142 extends perpendicularly from the infeed conveyor 130 at a downward angle towards, and out of, the front 218 of the frame 200. The redirect 144 is positioned across the infeed conveyor 130 from the slide 142 and is controllable by the robot controller 116 via connection 145 to move from an open position, shown in FIG. 3, to a closed position 310, as shown in broken line. In the closed position 310, the redirect 144 diverts an electronic device from the infeed conveyor 130 to the slide 142, which propels the electronic device downward and out of the robotic test system 100. In the illustrated embodiment, the slide 142 has a width of approximately 20 cm and a length of approximately 60 cm and the redirect 144 is of a type commercially available from Bimba Mfg. Co.

The vision guidance system 106 includes cameras 150 and 151. Camera 150 is mounted above the conveyor system 104 along the right side 306 of the frame 200 to look downward on the infeed conveyor 130 with a field of view 312 at a top surface of the infeed conveyor 130. Camera 150 is controlled by the robot controller 116 via connection 152 to capture images of the entire electronic device when the electronic device enters the robotic test system 100 on the infeed conveyor 130. To ensure that an image of the entire electronic device is captured, the field of view 312 must be larger than the electronic device and camera 150 must have sufficient resolution in the field of view 312. In the illustrated embodiment, the field of view 312 is approximately 9 cm in width and approximately 20 cm in length, which is larger than the aforementioned 5 cm by 16 cm printed circuit board and 5.5 cm by 16.5 cm radiotelephone, and camera 150 is mounted approximately 85 cm above the infeed conveyor 130 to have a resolution of 10/2540 cm in the field of view 312.

To facilitate image capture and image processing, the vision guidance system 106 includes conveyor lighting 154 associated with the infeed conveyor 130. The lighting 154 includes one or more lamps that are mounted in the test area 206 and arranged to maximize variation of reflectivity of an electronic device in the field of view 312. In one embodiment, the infeed conveyor 130 is opaque and the lighting 154 is mounted in the test area 206 beneath the infeed conveyor 130 opposite camera 150 to back light the field of view 312 at the surface of the infeed conveyor 130. Back lighting the infeed conveyor 130 with an electronic device present, creates a silhouette outline of the electronic device that, once captured, is easily processed by the robot controller 116.

Camera 151, which is substantially similar to camera 150 in type and make, is mounted in the accessible region 216 behind the conveyor 130 to look upward. Camera 151 is controlled by the robot controller 116 via connection 153 to capture close-up, high resolution images of the electronic device after it has been picked up by the end tool 120 of the robot arm 118. These images are used by the robot controller 116 to determine the position of the electronic device in the end tool 120. The robot arm 118 can vary the proximity of the picked electronic device to camera 151 to avoid resolution and field of view limitations existing with the arrangement of camera 150.

The images captured by the cameras 150 and 151 are coupled to the robot controller 116 via the connections 152 and 153, respectively, for inspection processing to primarily determine presence, location, orientation, and/or identity of the electronic device. The robot controller 116 preferably runs Aim VisionWare 3.0 software commercially available from Adept Technology, Inc. to perform all machine-vision inspections, but may alternately employ any other suitable vision software package that includes ruler tools for measuring distances; window tools for calculating intensity ranges in an image; and finder tools for locating lines, circles, and other features of objects placed in the field of view of a camera.

The barcode scanning station 108 includes a barcode scanner 160 that is mounted in the accessible region 216 of the test area 206 behind conveyor 130 and alongside camera 151 to face upward. The barcode scanner 160, which is preferably a barcode scanner commercially available from Microscan Systems, Inc. or suitable alternative, is controlled by the robot controller 116 via connection 161, such as an RS232 connection, to read a barcode, which is in a Code39 format or suitable alternative, from an electronic device brought in close proximity to the barcode scanner 160 by the robot arm 118. The barcode information read from the untested electronic device is coupled from the barcode scanner 160 to the robot controller 116 via connection 161. The robot controller 116 routes the barcode to the test equipment 110 via a multipurpose data switch (not shown), such as a 16 port data switch commercially available from Western Telematic Inc., and connection 170. Such barcode information is used by the test controllers 172 and/or a remote database (not shown) for tracking the electronic device during testing. In one embodiment, the barcode scanning station 108 further includes an identification matrix camera system, such as that commercially available from Brady U.S.A. Inc., which is controlled by the robot controller 116 to read a two-dimensional barcode from a component on a printed circuit board and route the two-dimensional barcode to the test equipment 110 via connection 170.

The test equipment 110 includes a plurality of test controllers 172 and a plurality of RF (radio frequency) test sets 173 that are positioned in the canopy 204 and the base 202 of the frame 200, respectively. The plurality of test controllers 172 includes twelve model HPE1421A 6-Slot VXI mainframe chassis, commercially available from Hewlett Packard, each employing three cards: a model V743 Controller card commercially available from Hewlett Packard, a GP (General Purpose) Relay Switch card commercially available from Hewlett Packard, and a Digital Input card commercially available from Hewlett Packard, or other suitable alternative. Each one of the test controllers 172 employs a UNIX operating system and RMB/UX (Rocky Mountain BASIC (Beginner's All Purpose Symbolic Instruction Code)/UNIX) software, sold by Hewlett Packard, for executing test instructions, or other suitable software alternatives. The plurality of RF test sets 173 includes twelve HP8920B Cellular Communication Test Sets, each of which is a complete RF cellular test set for testing cellular radiotelephones and is commercially available from Hewlett Packard, or other suitable alternative.

Each one of the test controllers 172 has a one-to-one correspondence with the robot controller 116, each one of the RF test sets 173, each one of the test fixtures 112, each one of the power supplies 113, and the UPS 115. Each of the test controllers 172 is coupled to the UPS 115 to prevent loss of test data in the event of a failure of the AC source coupled by the wall plug 114. Each of the test controllers 172 communicates load/unload request information regarding its corresponding one of the test fixtures 112 to the robot controller 116 via connection 170; communicates pass/fail and other test information regarding the electronic devices that it tests to the robot controller 116 via connection 170; communicates test instructions to, and receives test results from, its corresponding one of the RF test sets 173 via connection 175; places the electronic device under test in a powered-on state using a controlled power level supplied by its corresponding one of the power supplies 113 via connection 174; and communicates fixture control signals and electrical test commands to, and receives electrical test results from, its corresponding one of the test fixtures 112 via connection 174. Each of the RF test sets 173 receives RF output signals from its corresponding one of the test fixtures 112 via connection 176. Connections 170, 174, 175, and 176 preferably comprise twelve RS232 connections and 108 24

V digital input/output lines, 15 low frequency analog connections and 24 24 V digital input/output lines, 12 GPIB (General Purpose Interface Bus) connections, and twelve mini-coaxial cable connections, respectively, but may alternatively comprise other communication wiring schemes, protocols, or apparatuses.

The test fixtures 112 are positioned in the test area 206 between the conveyor system 104 and a back 220 of the frame 200. In the illustrated embodiment, the test fixtures 112, each of which have approximate length, width, and height dimensions of 40 cm, 10 cm, and 35 cm, respectively, are arranged in two rows of six. Each row is on an opposing side of the robot arm 118 and extends parallel to a transverse axis 314 of the frame 200 and the right 306 and left 308 sides of the frame 200. Such positioning of the test fixtures 112 around the robot arm 118 permits delivery of electronic devices to the test fixtures 112 via movement of the robot arm 118 in an arcuate path.

Each of the test fixtures 112 includes an enclosure, such as enclosure 316, that is within the accessible region 216 of the test area 206. The enclosure 316 is pneumatically driven by the air pressure source 121 to physically and electrically interface with an electronic device. A solenoid switch associated with the enclosure 316 is energized and deenergized in response to the fixture control signals sent by the corresponding one of the test controllers 172 via connection 174 to apply and remove, respectively, the air pressure source 121 used to effectuate interfacing of the electronic device. Once the electronic device is interfaced, the enclosure 316 couples the electrical test commands from connection 174 to the electronic device, and couples electrical test results and RF output signals from the electronic device to connections 174 and 176, respectively. Each of the test fixtures 112 includes an pneumatically driven interconnect (not shown) at its base for quick disconnection of the test fixtures 112 from the test equipment 110 and the air pressure source 121.

To facilitate access, each of the test fixtures 112 is mounted in a corresponding one of a plurality of test fixture drawers 178. Each of drawers 178 includes a slideable track assembly, such as track assembly 222, mounted in the test area 206 parallel to the longitudinal axis 304 of the frame 200. The track assembly 222 permits movement of the associated one of the drawers 178 away from the center of the robotic test system 100 and between an in position, which is shown in FIGS. 2 and 3, and an out position, in which the associated one of the drawers 178 is completely removed from the test area 206 via the left side 308 of the frame 200 such that the enclosure of the associated one of the test fixtures 112 is outside of the accessible region 216. Sensors mounted on the track assemblies signal the robot controller 116 and the test fixtures 112 via connection 179 as to the position of the drawers 178. In one embodiment, movement of any of the drawers 178 out of the in position directs the robot controller 116 to pause movement of the robot arm 118 until the drawer reaches the out position. Movement from the out position towards the in position pauses the robot arm 118 until the in position is reached.

The robotic test system 100 operates according to a method shown in FIG. 4. The method is stored in, and executed by, the robot controller 116 for each electronic device that enters the robotic test system 100, and will be described in conjunction with FIGS. 1–4. Initially, the infeed conveyor 130 is in a turned on state to move an electronic device into the robotic test system 100 via the right side 306 of the frame 200 (at step 400). As the infeed conveyor 130 moves the electronic device through the field of view 312, the robot controller 116 controls the camera 150 to capture an image of the electronic device (at step 402). The robot controller 116 processes the captured image to determine the location and orientation of the electronic device (at step 404). If either the location or the orientation of the electronic device can not be determined, the robot controller 116 activates the redirect 144 to remove the electronic device from the infeed conveyor 130, onto the slide 142, and out of the robotic test system 100 (at step 406). Failure to determine location or orientation can result from, for example, face down positioning of the electronic device on the infeed conveyor. Picking the electronic device from the infeed conveyor 130 and attempting to place it into one of the test fixtures 112, without first determining the location or orientation of the electronic device, can result in misplacement and damage to the one of the test fixtures 112 and the electronic device. Following removal of the electronic device, the robot controller 116 ends the method (at step 408).

If the location and the orientation of the electronic device are determined, the robot controller 116 controls the robot arm 118 and the end tool 120 to pick the electronic device from the infeed conveyor 130 (at step 410). The robot controller 116, responsive to signals from the encoder 138, translates the location of the electronic device from the point of image capture and controls the robot arm 118 to pick the electronic device from the infeed conveyor 130 while it is moving.

Once the electronic device is picked, the robot controller 116 controls the robot arm 118 to transport the electronic device in proximity to camera 151 (at step 416). Next, the robot controller 116 controls camera 151 to capture a second image of the electronic device (at step 418). The robot controller 116 processes the second image to locate a predefined feature on the electronic device, such as a fiducial on a printed circuit board, and defines a final location and orientation of the electronic device in the end tool 120 (at step 420). From the second image, the robot controller 116 can detect, and correct for, slight shifting of the electronic device that occurs when the electronic device is picked from the infeed conveyor 130 while the infeed conveyor 130 is moving. Alternatively, the robot controller 116 could ensure that the electronic device is horizontally level in the end tool 120 by placing the electronic device on a horizontally level stationary surface of the test area and repicking the electronic device therefrom.

Next, the robot controller 116 controls the robot arm 118 to transport the electronic device in proximity to the barcode scanner 160 of the barcode scanning station 108 (at step 422). The robot controller 116 controls the barcode scanner 160 to scan one or more barcodes carried on the electronic device (at step 424). If the barcode scanner 160 is unable to read the barcode(s) due to, for example, marring or absence of the barcode(s) (at step 426), the robot controller 116 controls the robot arm 118 to transport the electronic device to the fail conveyor 140 for delivery out of the robotic test system 100 (at step 428). To prevent collisions with electronic devices previously delivered to the fail conveyor 140, the fail conveyor 140 is incremented by the robot controller 116 an amount derived from the signals of the sensors 136 before or after each delivery. Following delivery of the electronic device, the robot controller 116 proceeds to the step 408 to end the method.

If the barcode(s) are successfully read (at step 426), the robot controller 116 waits to receive a load request from one of the test controllers 172 of the test equipment 110 (at step 429). Once received, the robot controller 116 communicates the barcode information read by the barcode scanner 160 to the one of the test controllers 172 of the test equipment 110 that sent the load request (at step 430). Next, the robot controller 116 controls the robot arm 118 to transport the electronic device to the one of the test fixtures 112 corresponding to the one of the test controllers 172 of the test equipment 110 that sent the load request (at step 432). In doing so, at least a portion of the robot arm 118 moves through an arcuate path in order to position the electronic device in vertical alignment with the enclosure of the one of the test fixtures 112. Next, the robot controller 116 translates the robot arm 118 and places the electronic device into the enclosure of the one of the test fixtures 112 (at step 434). In the illustrated embodiment, the robot controller 116 accomplishes the sequence of the steps 410, 416, 418, 420, 422, 424, 426, 430, 432, and 434 in approximately 3 secs. Once placed, the electronic device is tested.

Next, the robot controller 116 waits until an unload request is received from the one of the test controllers 172 of the test equipment 110 that is testing the electronic device (at step 436). Once the unload request is received, the robot controller 116 controls the robot arm 118 to reverse the aforementioned sequence of the steps 432 and 434 and unload the electronic device from the one of the test fixtures 112 corresponding to the requesting one of the test controllers 172 (at step 438). If an indication that the electronic device failed testing is received from the test equipment 110 (at step 440), the robot controller 116 proceeds to the step 428. If the robot controller 116 receives indications that the electronic device passed testing at the one of the test controllers 172 but still must undergo further testing by other testing systems (e.g., an additional one of the robotic test system 100 having its infeed conveyor aligned with outfeed conveyor 131) (at steps 440 and 442), the robot controller 116 transports the electronic device to, and places the electronic device on, outfeed conveyor 131 (at step 444). However, if the robot controller 116 receives indications that the electronic device passed testing at the one of the test controllers 172 and has completed all testing (at steps 440 and 442), the robot controller 116 transports the electronic device to, and places the electronic device on, outfeed conveyor 132 (at step 446). To avoid collisions, the robot controller 116 increments the outfeed conveyors 131 and 132 in the same manner previously described with respect to the fail conveyor 140. Following placement of the electronic device on one of the outfeed conveyors 131 and 132, the robot controller 116 proceeds to the step 408 to end the method. In the illustrated embodiment, the robot controller 116 unloads the electronic device at step 436 and transfers the electronic device to one of the conveyors 131, 132, and 140 at steps 428, 444, and 446, respectively, in approximately 2 secs.

As previously stated, the method of FIG. 4 is executed with respect to each electronic device that enters the robotic test system 100. In the illustrated embodiment, the robot controller 116 can maximize throughput and reduce cycle time by simultaneously executing the method of FIG. 4 for up to twelve electronic devices (i.e., one electronic device per each of the test fixtures 112). For example, while the robot controller 116 is waiting at step 429 for one electronic device, the robot controller 116 could be executing the steps 402, 404, 410, 416, 418, 420, 422, 424, 426, 430, 432, and 434 for another electronic device.

Thus, it can be seen that a test system can employ a single robot apparatus to transport electronic devices between a conveyor and a plurality of test fixtures. The robot apparatus is operable to rotate and move through arcuate paths to quickly deliver electronic devices to the test fixtures, which are arranged around the robot apparatus. Although shown to have a particular arrangement, one will recognize that the test system could have fewer or more of the conveyors and test fixtures alternately arranged within the accessible area of the robot apparatus.

What is claimed is:

1. A test system for testing electronic devices, the test system comprising:
   a frame comprising a base, a canopy, and a test area positioned therebetween;
   a plurality of test equipment housed in the base and the canopy;
   a conveyor system housed in the test area to convey the electronic devices;
   a vision guidance system housed in the test area to locate one of the electronic devices;
   a plurality of test fixtures housed in the test area, each of the plurality of test fixtures coupled to a corresponding one of the plurality of test equipment; and
   a robot apparatus comprising a robot arm and a robot controller, the robot arm mounted in the test area and having a plurality of rotational joints, the robot controller coupled to the plurality of test equipment, the conveyor system, and the vision guidance system, the robot controller, responsive to the vision guidance system, to control the robot arm to deliver the one of the electronic devices from the conveyor system to one of the plurality of test fixtures.

2. A test system according to claim 1 further comprising a barcode scanning station housed in the test area.

3. A test system according to claim 1 wherein the vision guidance system comprises a first camera and a second camera, the first camera positioned a first distance above the conveyor system to look downward on the conveyor system, the second camera positioned to be accessible by the robot arm at a second distance, the second distance smaller than the first distance.

4. A test system according to claim 1 further comprising a plurality of test fixture drawers, each one of the plurality of test fixture drawers having a corresponding one of the plurality of test fixtures mounted therein, each one of the plurality of test fixture drawers comprising a slideable track assembly mounted in the test area, the slideable track assembly to permit movement of the corresponding one of the plurality of test fixture drawers between an in position and an out position, the out position outside of the test area.

5. A test system according to claim 1 further comprising an end tool carried on the robot arm, the end tool operable to pick the one of the electronic devices from the conveyor system.

6. A test system according to claim 5 further comprising a tool changer coupled to the robot arm and the end tool, the tool changer to removably attach the end tool to the robot arm.

7. A test system according to claim 6 further comprising an end tool nest positioned in the test area, the end tool nest having at least one receptacle adapted to receive the end tool.

8. A test system according to claim 1 wherein
   the conveyor system comprises a first conveyor operable to deliver the electronic devices into the test area, and
   the vision system comprises a first camera coupled to the robot apparatus and positioned above the first conveyor to capture an image of the electronic devices at a predetermined location on the first conveyor.

9. A test system according to claim 8 further comprising a second camera coupled to the robot apparatus and positioned in the test area, the second camera to capture an image of the electronic devices after removal of the electronic devices from the first conveyor by the robot arm.

10. A test system for testing electronic devices, the test system comprising:
   at least one conveyor to convey at least one of the electronic devices;
   at least one test fixture to test the at least one of the electronic devices;
   a robot apparatus having a robot arm, the robot arm positionable within an accessible region to deliver the at least one of the electronic devices from the at least one conveyor to the at least one test fixture through an arcuate path; and
   an end tool carried on the robot arm, the end tool operable to pick the at least one of the electronic devices from the at least one conveyor.

11. A test system according to claim 10 further comprising a tool changer coupled to the robot arm and the end tool, the tool changer to removably attach the end tool to the robot arm.

12. A test system according to claim 10 further comprising an end tool nest positioned in the accessible region, the end tool nest having at least one receptacle adapted to receive the end tool.

13. A test system according to claim 10
   further comprising a vision guidance system, the vision guidance system comprising first and second cameras coupled to the robot apparatus, the first camera positioned to look downward on the at least one conveyor, the second camera positioned in the accessible area; and
   wherein the robot apparatus further comprises a robot controller, the robot controller performing the following steps:
      controlling the first camera to capture a first image of the at least one of the electronic devices,
      processing the first image to determine location and orientation of the at least one of the electronic devices,
      controlling, responsive to determining the location and orientation of the at least one of the electronic devices, the robot arm and the end tool to pick the at least one of the electronic devices from the at least one conveyor,
      controlling the robot arm to transport the at least one of the electronic devices in proximity to the second camera,
      controlling the second camera to capture a second image of the at least one of the electronic devices, and
      processing the second image to locate a predefined feature on the at least one of the electronic devices and to determine a final location and orientation of the at least one of the electronic devices in the end tool.

14. A test system according to claim 10
   further comprising a vision guidance system, the vision guidance system comprising a first camera coupled to the robot apparatus, the first camera positioned to look downward on the at least one conveyor; and
   wherein the robot apparatus further comprises a robot controller, the robot controller performing the following steps:
      controlling the first camera to capture a first image of the at least one of the electronic devices,
      processing the first image to determine location and orientation of the at least one of the electronic devices,
      controlling, responsive to determining the location and orientation of the at least one of the electronic devices, the robot arm and the end tool to pick the at least one of the electronic devices from the at least one conveyor while the at least one conveyor is moving,
      controlling the robot arm to place the at least one of the electronic devices on a horizontally level stationary surface, and
      controlling the robot arm and end tool to repick the at least one of the electronic devices from the horizontally level stationary surface, thereby ensuring that the at least one of the electronic devices is horizontally level in the end tool.

15. A test system for testing electronic devices, the test system comprising:
   at least one conveyor to convey at least one of the electronic devices;
   at least one test fixture to test the at least one of the electronic devices; and
   a robot apparatus having a robot arm, the robot arm positionable within an accessible region to deliver the at least one of the electronic devices from the at least one conveyor to the at least one test fixture through an arcuate path, and
   wherein the at least one test fixture is slideably mounted to permit movement between an in position and an out position, the out position outside of the accessible region.

16. A test system according to claim 15 further comprising:
   a frame comprising a base, a canopy and a test area positioned therebetween; and
   at least one piece of test equipment housed in one of the base and the canopy; and
   wherein
      the at least one conveyor is housed in the test area,
      the robot arm is mounted in the test area, and
      the at least one test fixture is housed in the test area, the at least one test fixture coupled to the at least one piece of test equipment.

17. A test system according to claim 16
   wherein the at least one test fixture is a plurality of test fixtures; and
   further comprising a plurality of test fixture drawers, each one of the plurality of test fixture drawers having a corresponding one of the plurality of test fixtures mounted therein, each one of the plurality of test fixture drawers comprising a slideable track assembly mounted in the test area, the slideable track assembly to permit movement of the corresponding one of the plurality of test fixture drawers between an the in position and the out position, the out position outside of the test area.

18. A test system according to claim 15 wherein the conveyor system comprises:
   a first conveyor operable to deliver the electronic devices into the test area;
   a second conveyor operable to deliver tested ones of the electronic devices away from the test area; and
   a third conveyor operable to deliver failed ones of the electronic devices away from the test area.

19. A test system according to claim 18 wherein the conveyor system comprises:
- a slide mounted to the first conveyor to extend at a downward angle therefrom; and
- a redirect coupled to the robot apparatus and mounted to the first conveyor at a location opposite the slide, the redirect movable between an open position and a closed position, the redirect, in the closed position, to divert the electronic devices from the first conveyor to the slide.

* * * * *